(12) United States Patent
Laleg et al.

(10) Patent No.: US 10,983,076 B2
(45) Date of Patent: Apr. 20, 2021

(54) MAGNETIC RESONANCE SPECTROSCOPY WATER SUPPRESSION METHOD AND DEVICE

(71) Applicants: KING ABDULLAH UNIVERSITY OF SCIENCE AND TECHNOLOGY, Thuwal (SA); UNIVERSITEIT GENT, Ghent (BE)

(72) Inventors: Taous Meriem Laleg, Thuwal (SA); Hacene Serrai, London (CA); Abderrazak Chahid, Thuwal (SA)

(73) Assignees: KING ABDULLAH UNIVERSITY OF SCIENCE AND TECHNOLOGY, Thuwal (SA); UNIVERSITEIT GENT, Ghent (BE)

( * ) Notice: Subject to any disclaimer, the term of this patent is extended or adjusted under 35 U.S.C. 154(b) by 0 days.

(21) Appl. No.: 16/754,907

(22) PCT Filed: Oct. 11, 2018

(86) PCT No.: PCT/IB2018/057899
§ 371 (c)(1),
(2) Date: Apr. 9, 2020

(87) PCT Pub. No.: WO2019/077449
PCT Pub. Date: Apr. 25, 2019

(65) Prior Publication Data
US 2020/0292476 A1 Sep. 17, 2020

Related U.S. Application Data

(60) Provisional application No. 62/718,023, filed on Aug. 13, 2018, provisional application No. 62/573,887, filed on Oct. 18, 2017.

(51) Int. Cl.
*G01N 24/08* (2006.01)
*G01R 33/46* (2006.01)

(52) U.S. Cl.
CPC ............. *G01N 24/08* (2013.01); *G01R 33/46* (2013.01)

(58) Field of Classification Search
CPC .............................. G01N 24/08; G01R 33/46
See application file for complete search history.

(56) References Cited

U.S. PATENT DOCUMENTS

| | | | | |
|---|---|---|---|---|
| 7,215,119 B2* | 5/2007 | Kruger | ................. | G01R 33/483 324/306 |
| 8,022,698 B2* | 9/2011 | Rottengatter | ............ | G01V 3/32 324/303 |
| 10,013,607 B2* | 7/2018 | Laleg-Kirati | ........ | G06K 9/6214 |

OTHER PUBLICATIONS

Barkhuijsen, H., et al., "Improved Algorithm for Noniterative Time-Domain Model Titting to Exponentially Damped Magnetic Resonance Signals," Journal of Magnetic Resonance (1969), July 2987, vol. 73, No. 3, pp. 553-557.

(Continued)

*Primary Examiner* — Reena Aurora
(74) *Attorney, Agent, or Firm* — Patent Portfolio Builders PLLC

(57) ABSTRACT

A method for suppressing a water line in an acquired magnetic resonance spectra (MRS) y, the method including receiving (800) the acquired MRS spectra y; estimating (802) a water peak $y_{wp}$ for the acquired MRS spectra y using squared eigenfunctions (ψ) of a Schrödinger operator H; and removing (804) the water peak $y_{wp}$ from the acquired MRS y to obtain a suppressed water MRS spectra $y_{ws}$. The suppressed water MRS spectra $y_{ws}$ includes a signature of one or more metabolites.

20 Claims, 16 Drawing Sheets

(56) References Cited

OTHER PUBLICATIONS

Helffer, B., et al., "On Semi-Classical Questions Related to Signal Analysis," Asymptotic Analysis, Sep. 2010, vol. 75, No. 3-4, pp. 125-144.
Laleg, T.-M., et al., "Arterial Blood Pressure Analysis Based on Scattering Transform I," Proceedings of the 29th Annual International Conference of the IEEE Engineering in Medicine and Biology Society (EMBS) 2007, Aug. 2007, pp. 5326-5329.
Laleg-Kirati, T.-M., et al. "Spectral Data De-Noising using Semi-Classical Signal Analysis: Application to Localized MRS," NMR in Biomedicine, Jul. 1, 2016, vol. 29, No. 10, pp. 1477-1485, Wiley.
Laleg-Kirati, T.-M., et al., "Semi-Classical Signal Analysis," Mathematics of Control, Signals, and Systems, Sep. 30, 2012, vol. 25, No. 1, pp. 37-61, Springer.
Laudadio, T., et al., "Improved Lanczos Algorithms for Blackbox MRS Data Quantitation," Journal of Magnetic Resonance, Aug. 2002, vol. 157, pp. 292-297, Elsevier Science (USA).
Pijnappel, W.W., et al., "SVD-Based Quantification of Magnetic Resonance Signals," Journal of Magnetic Resonance (1969), Mar. 1992, vol. 97, No. 1, pp. 122-134, Elseiver, Inc.
Chahid, A., et al., "Water Suppression in Magnetic Resonance Spectroscopy Using the Eigenfunctions of the Schrödinger Operator," Oct. 19, 2017, retrieved from the internet: URL: http://epostersonline.s3.amazonaws.com/esmrmb2017/esmrmb2017.65b37cc.NORMAL.pdf.
Graveron-Demilly, D., "Quantification in Magnetic Resonance Spectroscopy Based on Semi-Parametric Approaches," Magnetic Resonance Materials in Physics, Biology and Medicine, Jul. 28, 2013, vol. 27, No. 2, pp. 113-130, Springer.
International Search Report in corresponding/related International Application No. PCT/IB2018/057899, dated Jan. 18, 2019.
Laleg, M.T., et al., "Magnetic Resonance Spectroscopy Data De-Noising Using Semi-Classical Signal Analysis Approach: Application to In-Vitro MRS Data," Proceedings of the International Society for Magnetic Resonance in Medicine, 23rd Annual Meeting Y Exhibition, May 15, 2015, No. 1963, pp. 1963.
Mierisová, S., et al., "MR Spectroscopy Quantitation: A Review of Frequency Domain Methods," NMR in Biomedicine, Jun. 2001, vol. 14, No. 4, pp. 247-259, John Wiley & Sons, Ltd.
Poullet, J.-B., et al., "A New FIR Filter Technique for Solvent Suppression in MRS Signals," Journal of Magnetic Resonance, Oct. 14, 2008, vol. 196, pp. 61-73, Elsevier.
Serrai, H., et al., "Water Modeled Signal Removal and Data Quantification in Localized MR Spectroscopy Using a Time-Scale Postacquisition Method," Journal of Magnetic Resonance, Mar. 2001, vol. 149, pp. 45-51, Academic Press.
Written Opinion of the International Searching Authority in corresponding/related International Application No. PCT/IB2018/057899, dated Jan. 18, 2019.

\* cited by examiner

Algorithm 1 The SCSA reconstruction algorithm

Input: MRS signal $y(f)$, parameters: $h$.
Output: Reconstructed signal $y_h(f)$
Step 1: Discretization of the Schrodinger operator (eq. 2).
Step 2: Solving the eigenvalue problem.
Step 3: Selection of the negative eigenvalues and their associated $L^2$-normalized eigenfunctions.
Step 4: Reconstruction of the output signal $y_h(f)$ (eq. 4).

FIG. 1

Algorithm 2 Water peak estimation

400

Input :

$y$: input MRS signal

402  $N_{wp}$: Desired number of eigenfunctions

Output: $y_{wp}$: Estimated water peak $f_{water} \Leftarrow [-50Hz, 50Hz]$

408  ◇ *Reconstruct $y$ using $Nh_{wp}$ eigenfunctions*

$(h_{wp}, N_{wp}) \Leftarrow SCSA\_Nh(y, N_{wp})$ $\lambda, \psi = SCSA(y, h_{wp})$  ▷ Apply the SCSA using $h_{wp}$ 410  ◇ *Select the eigenfunctions contributing only to the water peak* for n $\Leftarrow 1 \rightarrow N_{wp}$ do if $max(\psi_n) \in f_{water}$ then

$S(n) \Leftarrow 1$    ▷ Selected eigenfunction end if end for

◇ *Subtract the water peak from the MRS spectra*

$$y_{wp}(f) = 4h_{wp} \sum_{n=1}^{N_{wp}} S(n) k_{nh} \psi_{nh}^2(f)$$

return $y_{wp}(f)$

404 function $(h_{wp}, N_h) = SCSA\_Nh(y, N_{wp})$ $h \Leftarrow max(y), \gamma \Leftarrow \frac{1}{2}$.

$(y_{out}, N_h) = SCSA(y, h)$

406   while $||N_h - N_{wp}|| \neq 0$ do

$h = h * \left(\frac{N_h}{N_{wp}}\right)$ $(y_{out}, N_h) = SCSA(y, h, \gamma)$ end while

$h_{wp} = h$ return $h_{wp}, N_h$

FIG. 4

Algorithm 3 Water residue attenuation

600

Input :
$y_{ws}$: water suppressed MRS signal
$L_{ws}$: number of loop used for attenuation
$N_{wr}$: The used number of eigenfunctions

Output: $y_{ws2}$: MRS signal with attenuated water residue $f_{water} \Leftarrow [-50Hz, 50Hz]$ 602   $y \Leftarrow y_{ws}(f_{water})$
for n $\Leftarrow 1 \rightarrow L_{ws}$ do
    $y_{wr} \Leftarrow SCSA\_Nh(y, N_{wr})$
end for

604  $y_{ws2} \Leftarrow y_{ws}$
$y_{ws2}(f_{water}) \Leftarrow y_{wr}$
return $y_{ws2}(f_{water})$

FIG. 6

|  | Mean | | Standard deviation | |
|---|---|---|---|---|
|  | SCSA | HLSVD-PRO | SCSA | HLSVD-PRO |
| NAA | 2.46 | 2.60 | 1.20 | 1.15 |
| Cho | 2.40 | 2.56 | 1.60 | 1.30 |
| Cr | 4.24 | 5.80 | 2.25 | 1.20 |
| mI | 14.70 | 25.60 | 9.76 | 10.80 |
| PCr | 13.40 | 17.12 | 5.38 | 8.10 |

FIG. 10

MAGNETIC RESONANCE SPECTROSCOPY WATER SUPPRESSION METHOD AND DEVICE

CROSS-REFERENCE TO RELATED APPLICATIONS

This application is a U.S. National Stage Application of International Application No. PCT/IB2018/057899, filed on Oct. 11, 2018, which claims priority to U.S. Provisional Patent Application No. 62/573,887, filed on Oct. 18, 2017, entitled "WATER SUPPRESSION IN MAGNETIC RESONANCE SPECTROSCOPY SPECTRA USING THE SQUARED EIGENFUNCTIONS OF THE SCHRODINGER OPERATOR," and U.S. Provisional Patent Application No. 62/718,023, filed on Aug. 13, 2018, entitled "SCSA BASED MATLAB TOOLBOX FOR 1H MR SPECTROSCOPIC WATER SUPPRESSION AND DENOISING," the disclosures of which are incorporated herein by reference in their entirety.

TECHNICAL FIELD

Embodiments of the subject matter disclosed herein generally relate to methods and systems for water suppression in Magnetic Resonance Spectroscopy (MRS) spectra, and more particularly, to mechanisms and techniques for more accurately suppressing a water line in the MRS spectra associated with various metabolites.

BACKGROUND

Magnetic resonance spectroscopy spectra provides information about tissue metabolism and helps to characterize neurological and metabolic diseases, and improve tumor treatment. Different post-processing pipelines have been developed to get optimal biomedical signals from the acquired data (MRS spectra) with sophisticated data fitting, peak suppression and denoising protocols. A large number of biomedical signals consist of pulses, which reflect biological activities and chemical properties of the human body. These signals allow the detection and quantification of highly concentrated brain metabolites, such as N-Acetyl-Aspartate (NAA), phospho-creatine (Cr) and Choline (Cho). In the case of abnormalities or in specific clinical conditions, some other metabolites can arise such as lactate (Lac).

However, the quantification of these metabolites is usually hampered by the presence of a large water peak, which is of the order of 10,000 compared to the metabolite resonances. Thus, the water peak obscures the signals of interest, making this method limited in its application. Various techniques have been developed for suppressing the water line for an appropriate metabolic quantification. The suppression can be achieved either before or after data acquisition, using either pre-processing or post-processing techniques, respectively.

In the pre-processing scheme, water-suppression is performed by a combination of frequency-selective saturation Radio-Frequency (RF) pulses and subsequent magnetic field gradients, which are played to saturate the water spins before the acquisition of the metabolic signals. Among these techniques are Chemical Shift Selective (CHESS) methods, multiple pulses with optimized flip angles (WET), variable power RF pulses with optimized relaxation (VAPOR) delays, and hyperbolic secant (HS) waveform as a 90 saturation pulse. Although these pre-processing techniques are widely used, they still suffer from spectral distortion, which may affect data analysis. Moreover, the relevance of non-water-suppressed acquisition for intra-scan motion correction has been proven to avoid artifacts, which are induced due to the motion of the patient inside the scanner. In addition, studies have shown that collecting the water signal may be used as a reference to correct the line-shape distortion caused by eddy currents, as an internal reference for absolute data quantification, or as an indication of the normal mammary tissue in breast cancer.

Therefore, post-processing techniques, based on signal-processing methods, might be considered as a good alternative to the pre-processing methods. Several signal analysis methods have been proposed as MRS post-processing techniques. An example is the well-known Hankel-Lanczos Singular Value Decomposition (HLSVD) method [1] and the Hankel Lanczos squares Singular Values Decomposition with Partial Re-Orthogonalization (HLSVD-PRO) [2], [3].

The HLSVD-based methods decompose the unsuppressed water MRS signal into a set of exponentially decaying components, and select those with frequencies close to the frequency of the water to reconstruct the water resonance. The method has faced several modifications to achieve a better performance. Other types of MRS water-suppression methods include Gabor transform, Wavelet transform, Fourier-based method that uses a convolution difference of the time-domain to remove the water peak, and FIR based filters (MP-FIR).

Optimization-based techniques have also been introduced to remove the water peak in MRS signals. Such methods include the Advanced Method for Accurate, Robust, and Efficient Spectral fitting (AMARES), the Automated Quantization of Short Echo time MRS Spectra (AQSES), and the semi-parametric approach using regularization. Despite the efforts in developing efficient water-suppression post-processing methods, there are still several challenges to be addressed. For instance, the shape of the estimated water line may easily deviate from the theoretical Lorentzian model, which leads to non-efficient water removal. In addition, the low signal-to-noise ratio (SNR) of the output signal, once the water line is removed, may affect data quantification.

Thus, there is a need to provide a new method that more accurately removes the water line and produces an output signal with a high SNR.

SUMMARY

According to an embodiment, there is a method for suppressing a water line in an acquired magnetic resonance spectra (MRS) y. The method includes receiving the acquired MRS spectra y; estimating a water peak $y_{wp}$ for the acquired MRS spectra y using squared eigenfunctions ($\psi$) of a Schrödinger operator H; and removing the water peak $y_{wp}$ from the acquired MRS y to obtain a suppressed water MRS spectra $y_{ws}$. The suppressed water MRS spectra $y_{ws}$ includes a signature of one or more metabolites.

According to another embodiment, there is a computing device for suppressing a water line in an acquired magnetic resonance spectra (MRS) y. The computing device includes an interface configured to receive the acquired MRS spectra y; and a processor connected to the interface and configured to estimate a water peak $y_{wp}$ for the acquired MRS spectra y using squared eigenfunctions ($\psi$) of a Schrödinger operator H, and to remove the water peak $y_{wp}$ from the acquired MRS y to obtain a suppressed water MRS spectra $y_{ws}$. The suppressed water MRS spectra $y_{ws}$ includes a signature of one or more metabolites.

According to still another embodiment, there is a non-transitory computer readable medium including computer executable instructions, wherein the instructions, when executed by a processor, implement instructions for suppressing a water line in an acquired magnetic resonance spectra (MRS) y. The instructions include receiving the acquired MRS spectra y; estimating a water peak $y_{wp}$ for the acquired MRS spectra y using squared eigenfunctions ($\psi$) of a Schrödinger operator H; and removing the water peak $y_{wp}$ from the acquired MRS y to obtain a suppressed water MRS spectra $y_{ws}$. The suppressed water MRS spectra $y_{ws}$ includes a signature of one or more metabolites.

BRIEF DESCRIPTION OF THE DRAWINGS

The accompanying drawings, which are incorporated in and constitute a part of the specification, illustrate one or more embodiments and, together with the description, explain these embodiments. In the drawings:

FIG. 1 illustrates an algorithm for reconstructing a signal based on the classical Schrödinger operator;

FIG. 4 illustrates an algorithm for calculating the reconstructed water peak from the MRS signal;

FIG. 6 illustrates an algorithm for calculating a water residue reduction;

FIG. 10 illustrates the results of the comparison of the method of FIG. 8 and the traditional method for simulated data;

DETAILED DESCRIPTION

Figure 2:
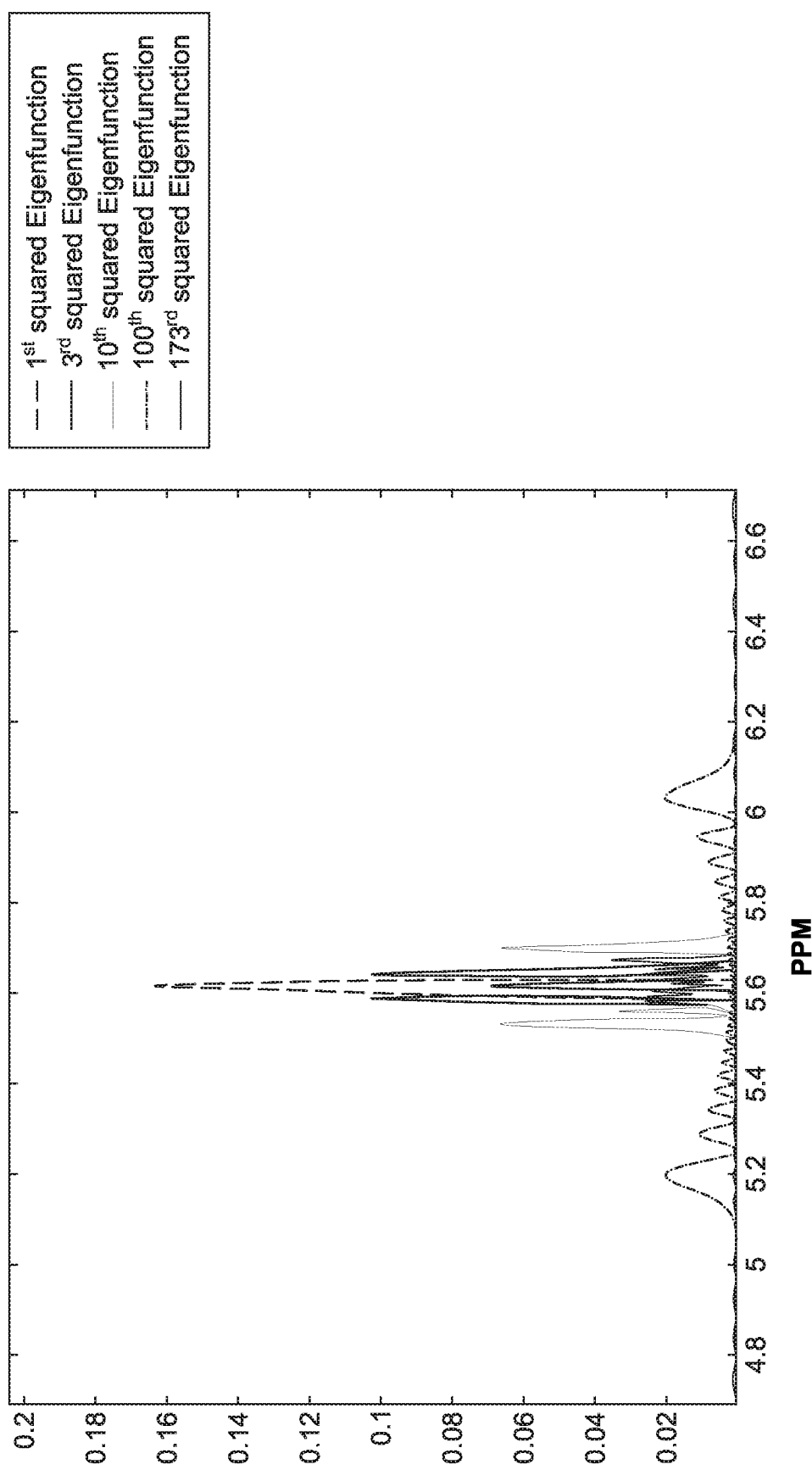
FIG. 2 illustrates the eigenfunctions of the reconstructed MRS signal.

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to proton MRS ($^1$H-MRS) measurements. However, the current inventive concepts may be used for other type of data analysis.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to various embodiments described in this section, a new water-suppression algorithm, based on the squared eigenfunctions associated with the negative eigenvalues of the Schrödinger operator is proposed. The input MRS signal is used as the potential for the Schrödinger operator. The eigenfunctions of the Schrödinger equation have been introduced in [4] for signal reconstruction and analysis and have been successfully used for the analysis of arterial blood pressure signal [5] as well as MRS denoising [6]. This method is referred herein to as Semi-Classical Signal Analysis (SCSA).

The squared eigenfunctions of the Schrödinger operator have very interesting properties, which are appropriate for their use for the analysis of pulse-shaped signals. The method discussed herein extends the usage of the SCSA method to water-suppression in MRS spectroscopy. The proposed approach, as discussed next, includes a first part that estimates the water peak by partially reconstructing the MRS spectrum, using a minimum number of eigenfunctions. This part uses an iterative optimization problem to find the optimal choice of the number of eigenfunctions. A second part of the method selects eigenfunctions belonging to the water peak, while those representing the metabolic peaks are discarded. Subtraction of the estimated water peak from the input MRS signal provides the suppressed water MRS spectrum. The third and last part of the method further reduces the water residue by filtering, if necessary, the water peak bandwidth using the SCSA method.

Before discussing the novel method, a brief discussion of the SCSA algorithm is believed to be in order. The use of the eigenfunctions of the Schrödinger operator for signal decomposition and representation has been introduced in [4] and [7], where it has been proven that a real positive input signal y(f), where f is the frequency of the signal, that represents the real part of the MRS spectrum, can be approximated by the estimated signal $y_{h,\gamma}(f)$ given in the following form:

$$y_{h,\gamma}(f) = \left( \frac{h}{L_\gamma^{cl}} \sum_{n=1}^{N_h} (-\lambda_{nh})^\gamma \psi_{nh}^2(f) \right)^{\frac{2}{1+2\gamma}}, \quad (1)$$

where h and $\gamma \in \mathbb{R}^*_+$, $\lambda_{nh}$ represents the negative eigenvalues of the Schrödinger operator, with $\lambda_{1h} < \ldots < \lambda_{N_h h} < 0$, $\psi_{nh}^2$ are the associated L2-normalized eigenfunctions, $N_h$ is the number of negative eigenvalues, and $$L_\gamma^{cl} = \frac{1}{2^2\pi} \frac{\Gamma(\gamma+1)}{\Gamma(\gamma+2)}$$

is the most suitable universal semi-classical constant, where $\Gamma$ refers to the standard Gamma function. The Schrödinger operator H(y) is defined as follows:

$$H(y) = -h^2 \frac{d^2}{df^2} - y, \quad (2)$$

where the input signal y is the potential of the operator. When the Schrödinger operator H(y) is applied onto the eigenfunction ψ(f), the following relation is true:

$$H(y)\psi(f) = \lambda \cdot \psi(f). \quad (3)$$

Equation (1) provides an exact reconstruction of the input signal y(f) when parameter h converges to zero. This is the reason for calling this method semi-classical signal analysis, where h is called the semi-classical parameter. Moreover, when h decreases, the number of eigenvalues increases and the reconstruction improves, as explained in [4]. The effect of the parameter γ has been discussed in [7]. In this application, γ is selected to be one half, and thus, the reconstruction equation (1) becomes:

$$y_h(f) = 4h \sum_{n=1}^{N_h} \phi_{nh}(f), \quad (4)$$

where the spectral components $\phi_{nh}(f)$ are weighted by the parameter 4h, and they are defined as follows:

$$\phi_{nh}(f) = \kappa_{nh} \psi_{nh}^2(f), \quad (5)$$

where $\kappa_{nh}$ is the square root of the negative eigenvalues of the Schrödinger operator, i.e., $\kappa_{nh} = \sqrt{(-\lambda_{nh})}$.

An algorithm that implements the SCSA method is illustrated in FIG. 1. Note that this algorithm takes as input the MRS signal y(f) and parameter h. Then, the algorithm applies the Schrödinger operator (see equation (2)) to the input data, solves this equation based on equation (3) to determine the eigenvalues, which are positive and negative. Then, the algorithm selects only the negative eigenvalues and their associated $L^2$-normalized eigenfunctions and finally it reconstructs the output signal $y_h(f)$ based on equation (4). In this regard, FIG. 2 shows a shape of the spectral components $\phi_{nh}(f)$ corresponding to the first and last squared eigenfunctions for a given MRS signal.

As the signals from the MRS spectra are pulse-shaped, the SCSA method for pulse-shaped signal reconstruction is now discussed. The SCSA is efficient in dealing with pulse-shaped signals, due to the nature of the squared eigenfunctions of the Schrödinger operator. It is known that the first squared eigenfunctions of the Schrödinger operator are localized at the maximum of the analyzed signal (i.e., the water peak in MRS spectrum) [6]. Moreover, as the parameter h decreases, the eigenfunction oscillations increase and their amplitudes decrease (for the nth eigenfunction, the number of oscillations is given by n+1), as illustrated in FIG. 2, which shows the amplitude of the eigenfunctions. Because of the multi-peak nature of the MRS spectra, the SCSA is well-adapted for their analysis.

However, two important challenges have to be addressed. The first challenge is the significant difference in amplitude between the water peak and the metabolic peaks. The second challenge is the insufficient number of data points representing the MRS signal. In this regard, for high amplitude signals (e.g., the water peak), the required number of eigenfunctions for signal reconstruction is very large. This number cannot be reached as it is limited by the size of the discrete Laplacian, which depends on the number of data points. Therefore, the SCSA algorithm needs to be adapted to overcome these limitations.

Figure 3:
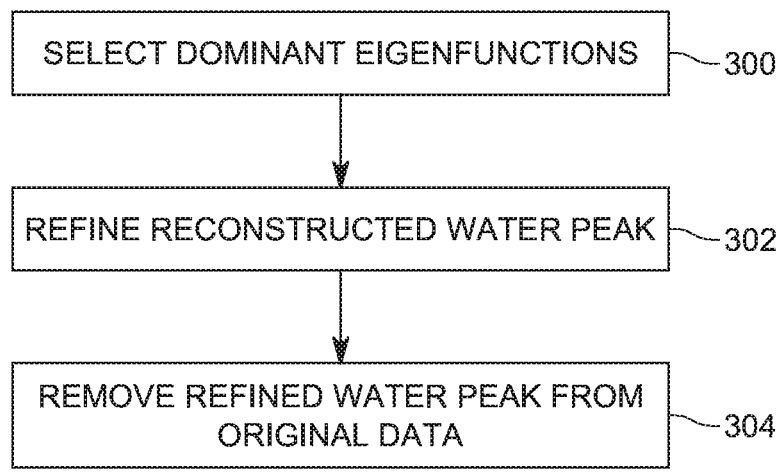
FIG. 3 is a flowchart of a method for reconstructing the water peak in the MRS signal.

The new proposed SCSA-based algorithm (to be discussed later in more detail) removes the water peak from the MRS signal in three steps as illustrated in FIG. 3. In step 300, the method uses only those eigenfunctions that dominantly reconstruct the water peak and have a negligible contribution to the reconstruction of the metabolites. In other words, the number of eigenfunctions that is used for reconstructing the signal is selected to be small. In step 302, the method refines the reconstructed water peak by removing the eigenfunctions that are localized in the metabolites bandwidth. Finally, in step 304, the method subtracts the estimated water peak from the MRS signal to provide the water-suppressed MRS spectra. These three steps are now discussed in more detail.

Regarding the first step, i.e., the water peak reconstruction step, the largest $N_{wp}$ eigenfunctions with their weighted eigenvalues (to be discussed later), contribute mostly to the water peak. One criteria to determine a large eigenfunction is to look at the value of its eigenvalue. Thus, a largest eigenfunction is considered in this embodiment to be that function that has the largest eigenvalue. Therefore, in this embodiment, the number $N_{wp}$ of eigenfunctions selected to reconstruct the water peak is between 5 and 15. Alternatively, the number $N_{wp}$ of eigenfunctions selected to reconstruct the water peak is about N/140, where N is a length of the input spectra. In one application, N/140 represents 0.8% of the length N. In one application, the number $N_{wp}$ of eigenfunctions is 7. In still another application, the number $N_{wp}$ of eigenfunctions is 9.

An optimal value of h, referred herein as $h_{wp}$, should be determined in order to decompose the MRS signal into the $N_{wp}$ selected eigenfunctions. The optimal value $h_{wp}$ may be found by applying an iterative optimization process as discussed later in FIG. 4, or by applying the iterative optimization process that minimizes a cost function g(y, h), which depends on the input signal y and the parameter h. The cost function g(y, h) is given by:

$$g(y,h) = \|N_h - N_{wp}\|_2^2 \quad (6)$$

where the number $N_h$ of eigenfunctions depends on the value of h. For example, for a large h, the number $N_h$ of eigenfunctions is small, and for a small h, the number of $N_h$ of eigenfunctions is large. Thus, the cost function of equation (6) is minimized based on the parameter h being subject to 0<h<max(y), where max(y) refers to the amplitude of the signal y. In other words, for various values of the parameter h, the $N_h$ is calculated until a difference between $N_h$ and $N_{wp}$ is minimized, as described by equation (6). The value of h for which the function g is minimized is $h_{wp}$. Note that in this step, the value of $N_{wp}$ is fixed, i.e., it has been selected to be 7 or 9 or any number between 5 and 15. Those skilled in the art would understand that this range of 5 to 15 may change depending of the input signal y. At the end of this step, the optimal value of $h_{wp}$ is determined. Thus, each one of the computed $N_{wp}$ eigenfunction (using value $h_{wp}$) contributes to the reconstruction of the MRS signal y as noted in the following equation:

$$y_{wp}(f) = 4h_{wp} \sum_{n=1}^{N_{wp}} \kappa_{nh} \psi_{nh}^2(f). \quad (7)$$

The next step uses the $N_{wp}$ eigenfunctions determined in the previous step and refines the water peak. This step is achieved by selecting only those eigenfunctions that contribute mostly (in terms of their amplitude) to the estimated water peak $y_{wp}(f)$. Thus, the refined estimated water peak is given in this step by:

$$y_{wp}(f) = 4h_{wp} \sum_{n=1}^{N_{wp}} S(n) \cdot \kappa_{nh} \psi_{nh}^2(f), \quad (8)$$

where the selection function S(n) is defined as:

$$S(n) = \begin{cases} 1, & \text{if } \psi_{nh}(f) \text{ is selected} \\ 0, & \text{otherwise.} \end{cases} \quad (9)$$

The calculations associated with the two steps 300 and 302 are illustrated as a computer algorithm in FIG. 4. The algorithm starts with step 400 in which the input is the MRS signal y, and the desired number $N_{wp}$ of eigenfunctions to be used for reconstructing the signal y. The frequency bandwidth $f_{water}$ for the water may also be input as a range, for example, between −50 Hz and 50 Hz. Note that if this method is modified to calculate the line of another substance than water, the frequency bandwidth of that substance is introduced here. Then, the algorithm generates in step 402 the estimated water pear $y_{wp}$. The calculations involved for generating the output in step 402 include determining in step 404 the optimal value of $h_{wp}$, which is calculating using an iterative optimization process 406 for the optimal value h. Having the value of $h_{wp}$, the algorithm applies in step 408 the SCSA algorithm (see FIG. 1 and associated description) for calculating the water peak $y_{wp}(f)$. In step 410, the algorithm applies the selection function S(n) (see equation (9)) for selecting the eigenfunctions to be used for refining the value of the estimated water peak.

Figure 5A:
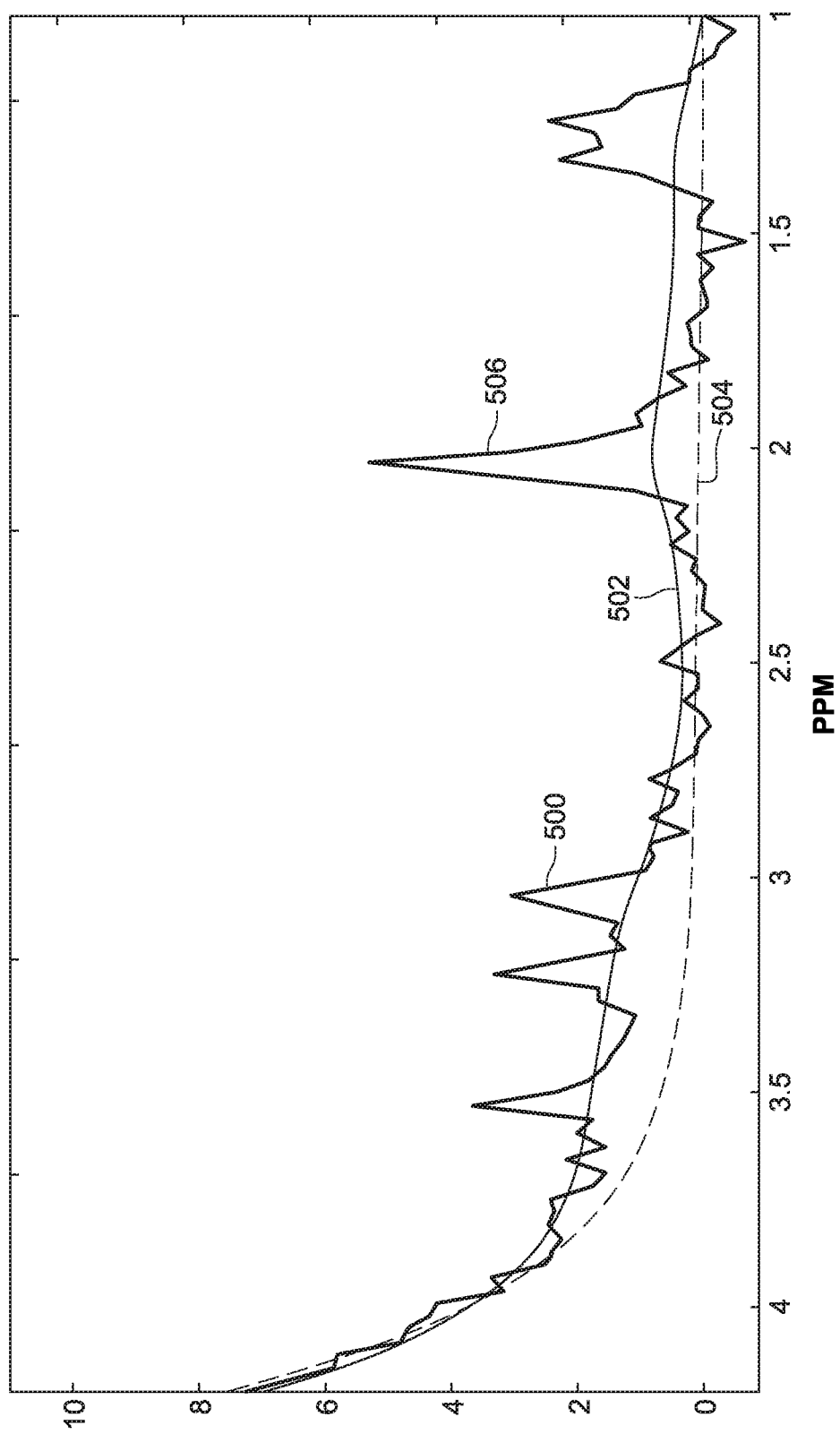
FIGS. 5A and 5B illustrate the original MRS signal, the reconstructed water peak based on the Schrödinger operator, and the refined water peak obtained by selecting certain eigenfunctions.
Figure 5B:
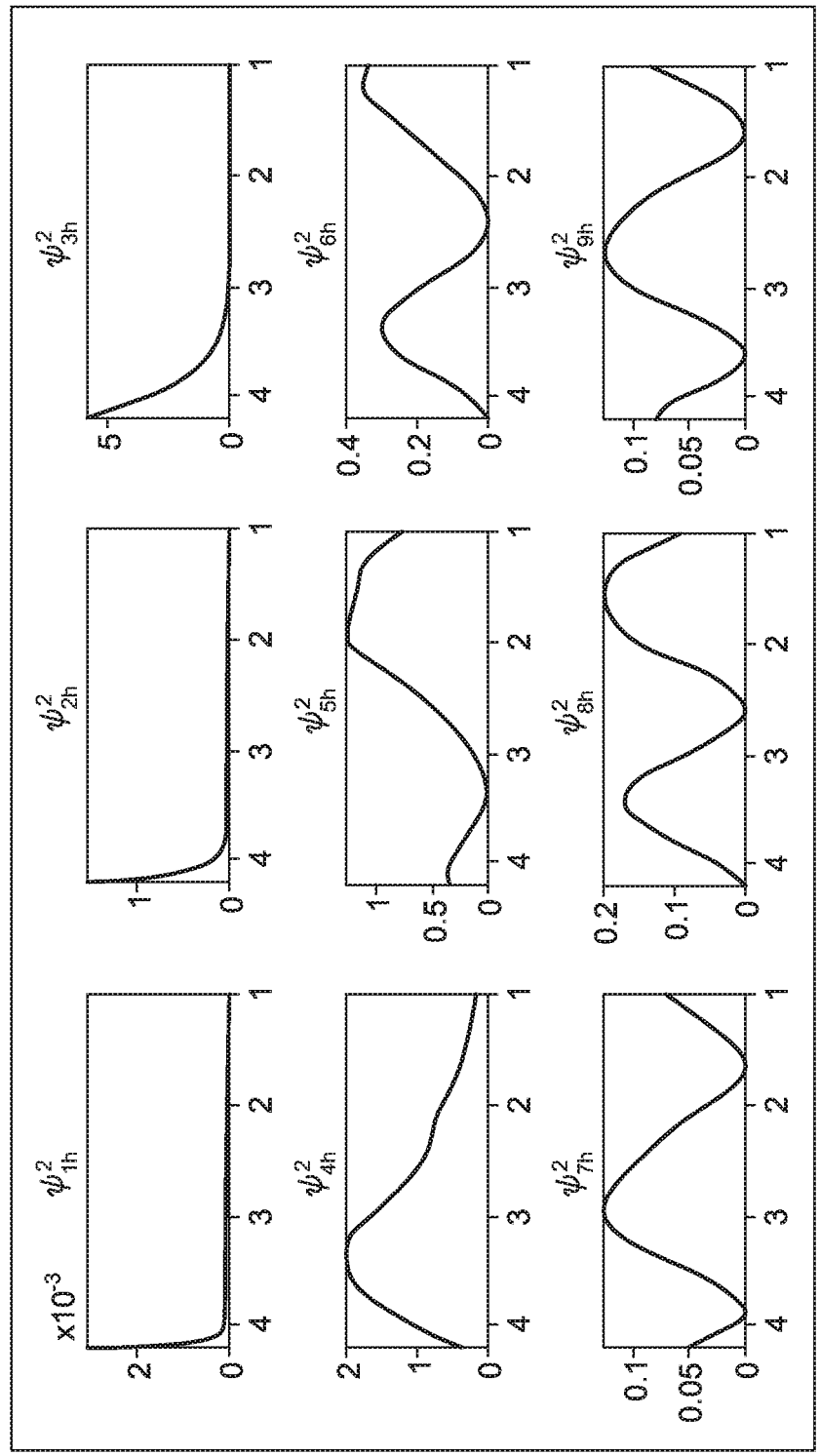

An example of applying the algorithm of FIG. 4 is illustrated in FIGS. 5A and 5B. FIG. 5A shows the input MRS signal y 500. FIG. 5B shows $N_{wp}$=9 eigenfunctions, where n varies from 1 to 9. The 9 eigenfunctions are shown squared in FIG. 5B. When the algorithm of FIG. 4 uses all $N_{wp}$=9 eigenfunctions, i.e., no selection function S(n), the reconstructed water peak 502 is obtained. When the selection function S(n) is used, only the first three largest eigenfunctions are selected, which results in the refined reconstructed water peak 504. Note that the water peak 506 has been removed.

Step 304 in FIG. 3 involves removing the estimated and refined water peak from the MRS signal y, to obtain the suppressed water MRS signal $y_{ws}(f)$, which is given by:

$$y_{ws}(f) = y(f) - y_{wp}(f). \quad (10)$$

Figure 7:
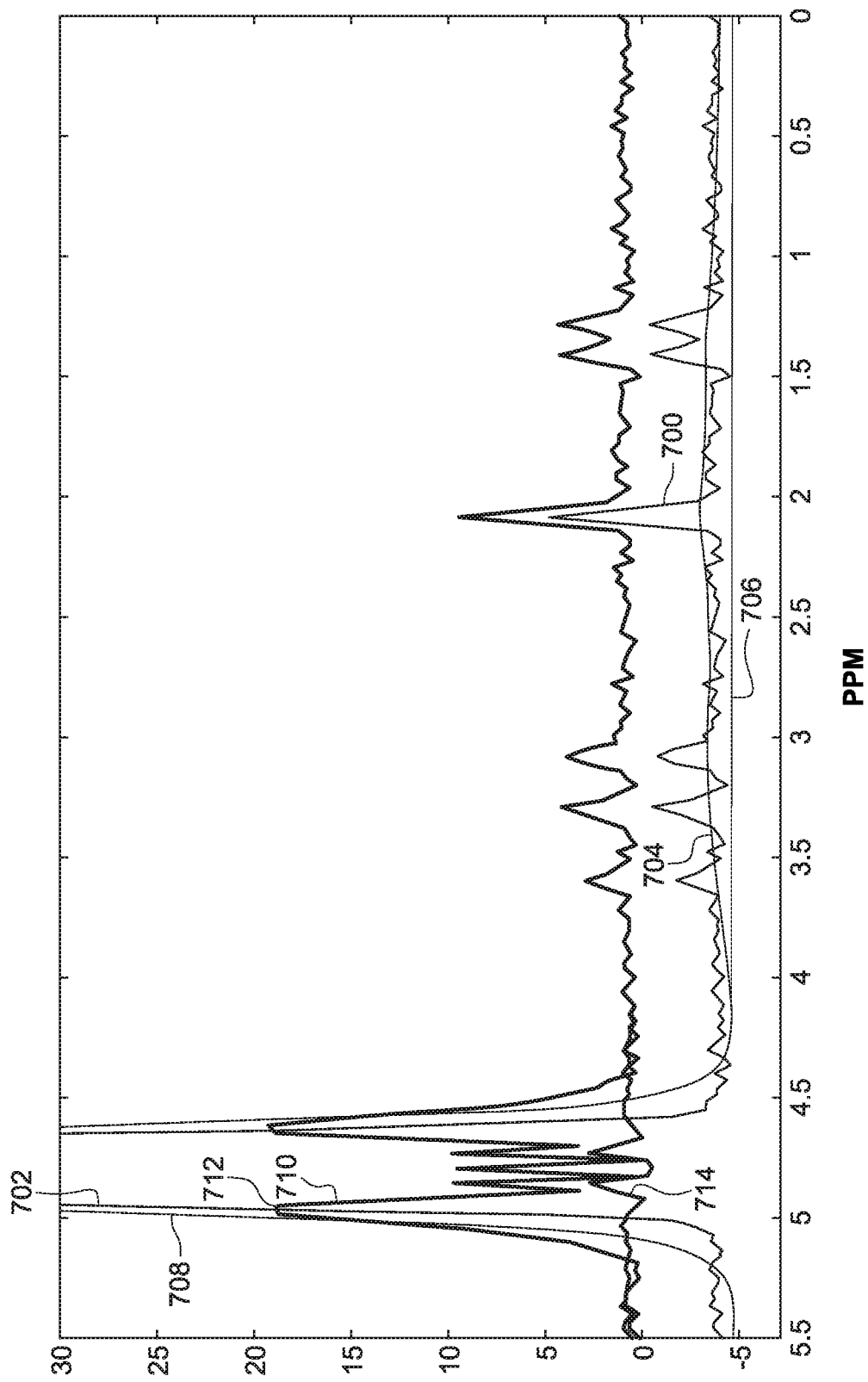
FIG. 7 illustrates the water residue reduction calculated in FIG. 6.

In some water-suppression cases the water residue is still large and this residue might affect the convergence of the used quantification method. To solve this problem, the water residue may be reduced as discussed with regard to the algorithm shown in FIG. 6 and the results shown in FIG. 7. The algorithm illustrated in FIG. 6 uses as input in step 600 the water suppressed MRS signal $y_{ws}$ obtained in equation (10), the number of loops $L_{ws}$ for the attenuation of the peak, and the number of used eigenfunctions $N_{wr}$. The frequency bandwidth of the water $f_{water}$ needs also to be input. The algorithm loops in step 602 the SCSA process for the number of used eigenfunctions $N_{wr}$ to reconstruct the data y, and the calculates in step 604 the new MRS signal $y_{ws2}$ with the reduced residual. FIG. 7 shows the MRS signal 700 having the large peak 702, the reconstructed water peak 704 (using the algorithm shown in FIG. 4), the estimated water peak 706, which still has a large peak 708, the water suppressed MRS signal 710 having a reduced peak 712, and the residual reduction 714.

Figure 8:
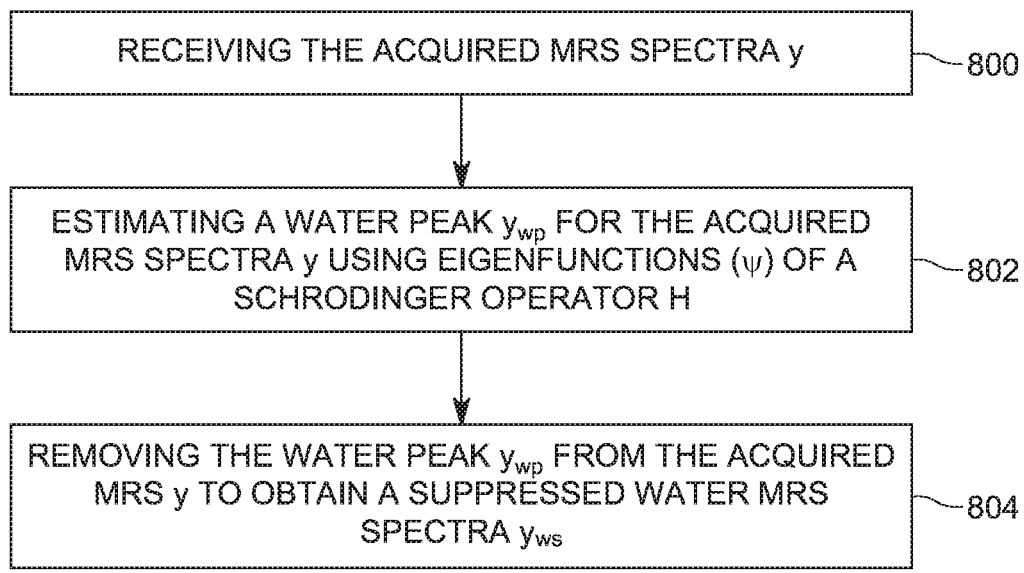
FIG. 8 is a flowchart of a method for removing a water line from MRS spectra.

A method for suppressing a water line in an acquired magnetic resonance spectra (MRS) y is now discussed with regard to FIG. 8. The method includes a step 800 of receiving the acquired MRS spectra y, a step 802 of estimating a water peak $y_{wp}$ for the acquired MRS spectra y using squared eigenfunctions (ψ) of a Schrödinger operator H, and a step 804 of removing the water peak $y_{wp}$ from the acquired MRS y to obtain a suppressed water MRS spectra $y_{ws}$, where the suppressed water MRS spectra $y_{ws}$ includes a signature of one or more metabolites.

Step 800 may also include a sub-step of selecting a number $N_{wp}$ of eigenfunctions, where the number $N_{wp}$ of eigenfunctions corresponds to those eigenfunctions that have the largest corresponding eigenvalues.

The method of FIG. 8 may further include a step of calculating an optimal value $h_{wp}$ of a parameter h of the Schrödinger operator H, where the step of calculating includes minimizing a cost function that depends on (1) the number $N_{wp}$ of eigenfunctions and (2) a number $N_h$ of eigenfunctions that use the parameter h.

The method may further include a step of calculating a number $N_h$ of eigenfunctions that use the parameter h, and a step of calculating eigenfunctions and eigenvalues of the Schrödinger operator H for the optimal value $h_{wp}$. The acquired MRS spectra y is used as a potential of the Schrödinger operator H.

The method may further include a step of selecting only eigenfunctions that have a frequency corresponding to the water frequency for refining the water peak. Further, the method may include a step of calculating a water residue based on a ratio between (1) the suppressed water MRS spectra $y_{ws}$ for the water frequency, and (2) the suppressed water MRS spectra $y_{ws}$ for the metabolites frequency and a step of identifying the one or more metabolites based on the suppressed water MRS spectra $y_{ws}$.

The method discussed above has been tested on simulated data and actual data as now discussed. For the first test, the MRS data was simulated with brain metabolites like choline (Cho), creatine (Cr), N-acetylaspartate (NAA), myo-Inositol (mI) and lactate (lac), along with water, using a Lorentzian lineshape according to the following equation:

$$s(t) = \sum_{m=1}^{M} A_m e^{(-(d_m + \Delta d) + 2\pi i (f_m + \Delta f))t} + \epsilon(t), \quad (11)$$

where s(t) is the simulated signal with t as the time variable, $A_m$ denotes the amplitude of a metabolite m, and Δexpresses a change. For the simulation, m ranges from 1 to 7 with five singlet peaks for water, Cho, Cr, NAA and mI, and a doublet for lactate. The variables $d_m$ and $f_m$ are the damping factors (based on the apparent relaxation time T2* values) and the frequencies of the peaks, respectively, obtained from literature. The term ∈(t) describes the noise. The B0 field inhomogeneity, replicating the in vivo conditions in the human brain, was introduced. This changes the damping factors and the frequencies of the metabolite peaks by the factors Δd and Δf respectively, in equation (11). Both Δd and Δf were varied between B1=3 Hz, B2=5 Hz, B3=7 Hz, B4=10 Hz, B5=13 Hz respectively. The terms B1-B5 denote the change in frequencies due to the effect of B0 field inhomogeneity. A white Gaussian noise was added to the data in order to obtain two SNR values of 2:5 and 4:5. The SNR is calculated from the real part of the frequency domain signal as:

$$SNR = \frac{NAA \text{ peak area}}{\text{standard deviation of noise}}. \quad (12)$$

In another simulation dataset, the same metabolites, as mentioned above along with the water, were simulated using a Gaussian line shape with the same acquisition parameters according to the following equation:

$$s(t) = \sum_{m=1}^{M} A_m e^{(-(d_m + \Delta d) + 2\pi i (f_m + \Delta f))t} + \epsilon(t), \quad (13)$$

A white Gaussian noise was added to the data in order to obtain two SNR values of 5 and 12. Both $\Delta d$ and $\Delta f$ were varied between B1=3 Hz, B2=5 Hz, B3=7 Hz, B4=10 Hz, B5=13 Hz respectively, due to the effect of B0 field inhomogeneity, as above.

For the second test, real data has been used. Phantom in vitro and human in vivo data were collected from a whole body scanner with a total gradient strength of 45 mT/m and a nominal slew rate of 200 mT/m/s. A 32-channel receive head coil was used for data acquisition. In vitro CHESS water suppressed and unsuppressed data was collected using a single voxel spectroscopy (SVS) sequence, from a cylindrical water solution phantom containing tubes filled with brain metabolite solutions of NAA, lac, Cho, and Cr with known concentrations of 10:5 mM, 25 mM, 9:8 mM, 4:5 mM, respectively. The water line was calculated from the unsuppressed water data and used as an internal reference to estimate the absolute concentrations of the metabolites. The absolute concentrations of the metabolites were estimated using the following equation:

$$C_{metabolite} = C_{water} \times \frac{2}{np} \times \frac{\exp(TE/T2_{metabolite})}{\exp(TE/T2_{water})} \times \frac{A_{metabolite}}{A_{water}} \times \frac{1 - \exp(-TR/T1_{water})}{1 - \exp(-TR/T1_{metabolite})}, \quad (15)$$

where the variable $C_{metabolite}$ is the metabolite concentration (M), $C_{water}$ is the water concentration used as internal reference (110M), $A_{metabolite}$ is the area of the metabolite peak, $A_{water}$ is the area of the water peak calculated from the unsuppressed water data, np is the number of protons in a given metabolite, and $T1_{metabolite}$, $T2_{metabolite}$, $T1_{water}$, and $T2_{water}$ are the relaxation times of the metabolites and water respectively.

In vivo CHESS water suppressed data was collected from a healthy volunteer from two voxels, one at the center and the other at the edge of the field of view (FOV), using the Chemical shift imaging (CSI) sequence. Metabolite ratios for NAA/Cr and Cho/Cr were calculated in each voxel after the residual water-suppression.

Data simulation and quantification was performed using an inhouse Matlab (MathWorks, USA) program. Water suppression was performed using both SCSA and HLSVD-PRO [2], [3] algorithms, for comparison purposes. All spectra were phase corrected with respect to the water peak before suppression. The model order of HLSVD-PRO was set to 10 to remove the water residue from all spectra. This model order was chosen as it provided the optimum suppression considering all the data collected. The metabolite peaks were fitted to a Lorentzian model using an iterative baseline estimation and peak fitting approach. This approach has been previously shown to yield better quantification results as compared to a single pass optimization method that models baseline and metabolite signal together. Singular spectrum analysis was used for baseline estimation, and HLSVDPRO [2], [3], [8] with model order of 30 for spectral fitting. As other advanced time domain based quantification methods require extensive prior knowledge about the resonance frequencies and damping factor values, the inventors have used HLSVD-PRO for the quantification, which models the metabolites as a sum of damped exponential signals and estimates the amplitude values quickly. All the metabolite peaks, Cho, Cr, NAA, ml and lac, in the frequency range 1 to 4 PPM were fitted. The HLSVD-PRO model order was kept equal to 30 for an optimal fitting of the metabolite peaks in the given frequency range. The fitted peak amplitude is defined as the integral (area under the curve) of the real part of the fitted frequency domain signal, and considered as a measure of quantification. The residue was also calculated by subtracting the fitted signal from the original signal after water-suppression.

Figure 9A:
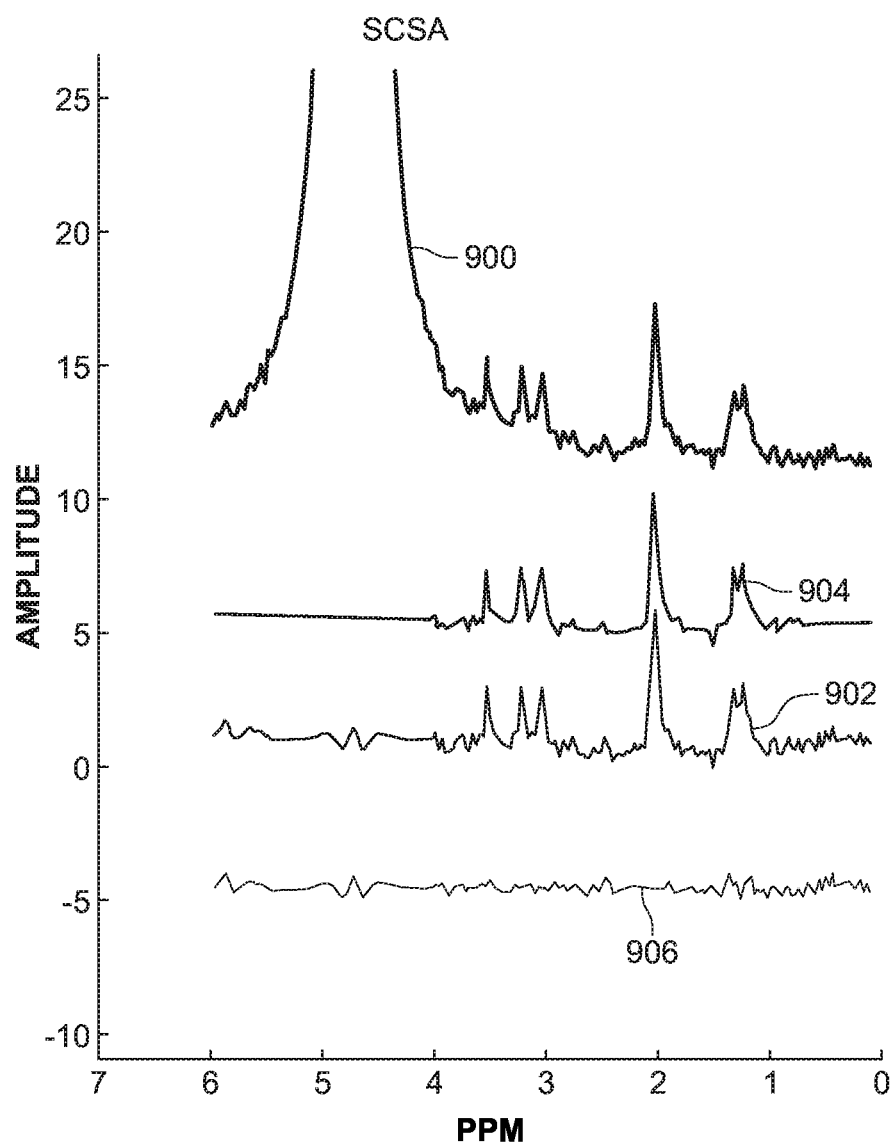
FIGS. 9A to 9D compare the method of FIG. 8 with a traditional method.
Figure 9B:
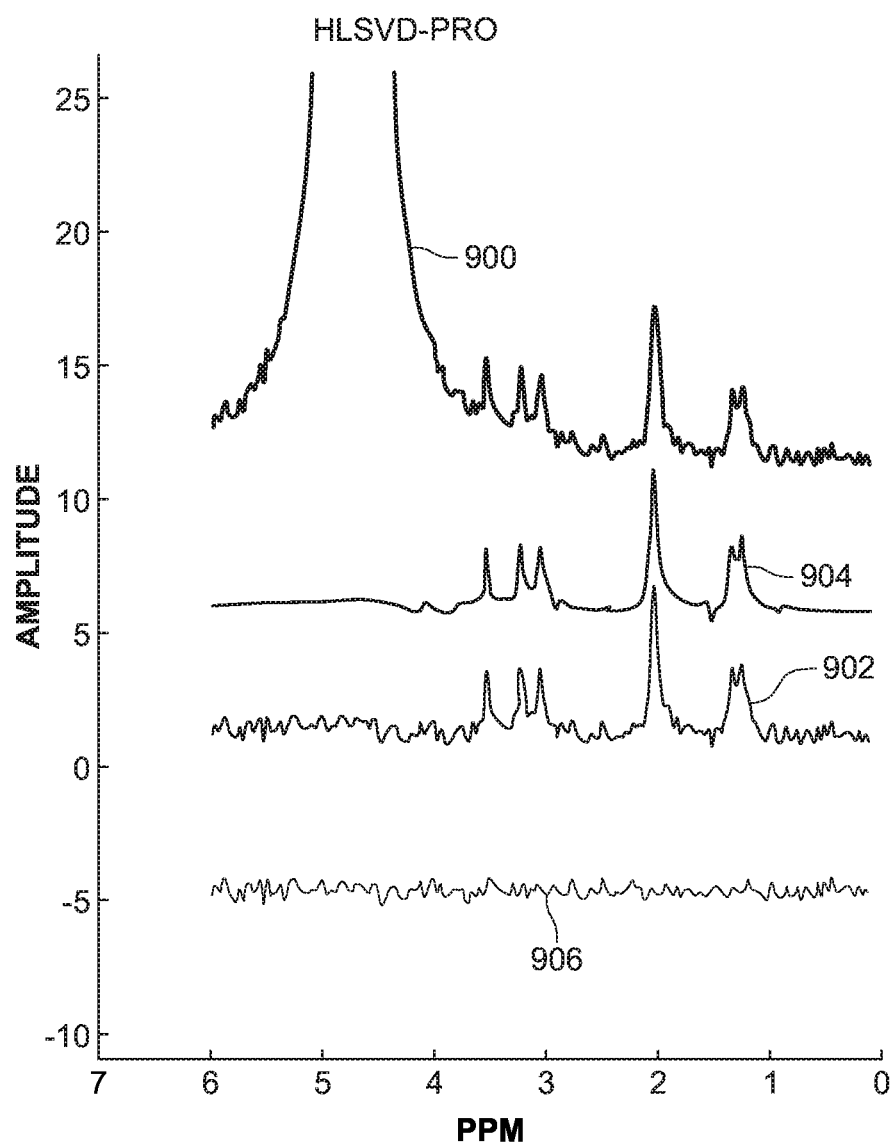
Figure 9C:
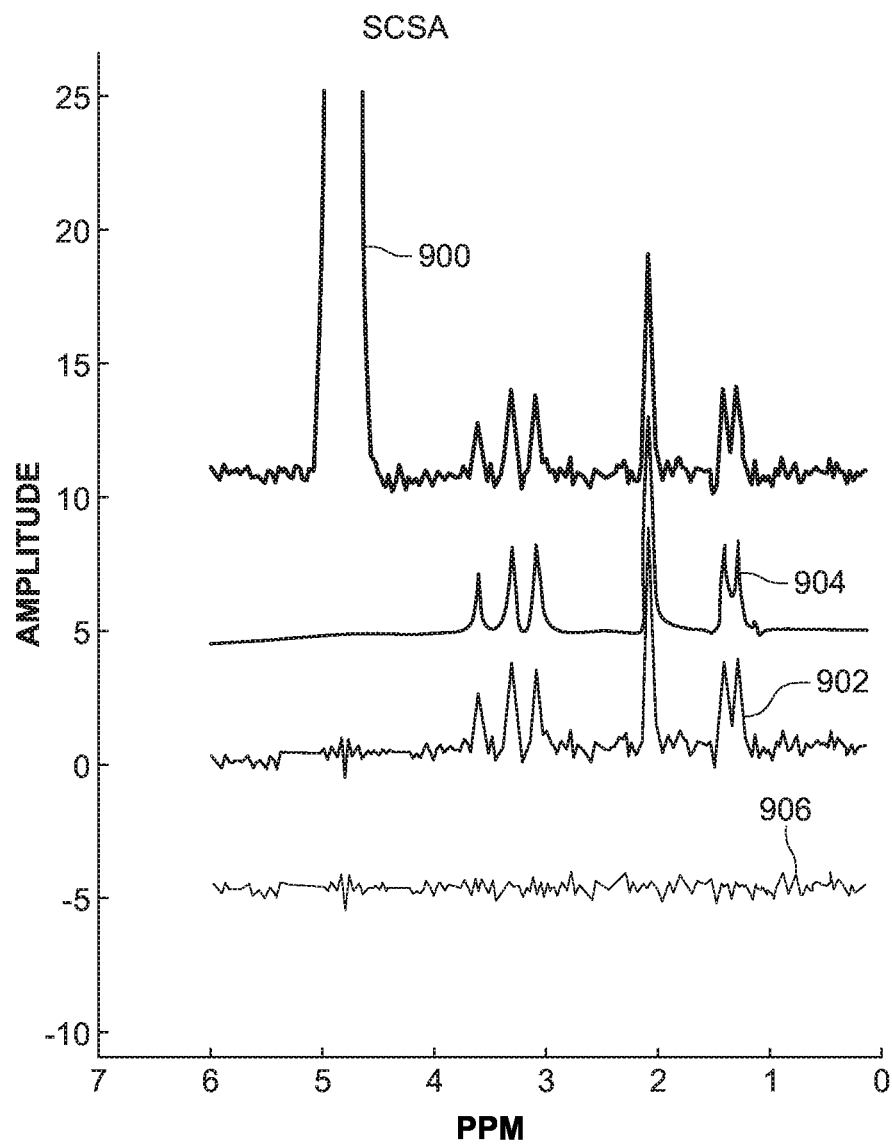
Figure 9D:
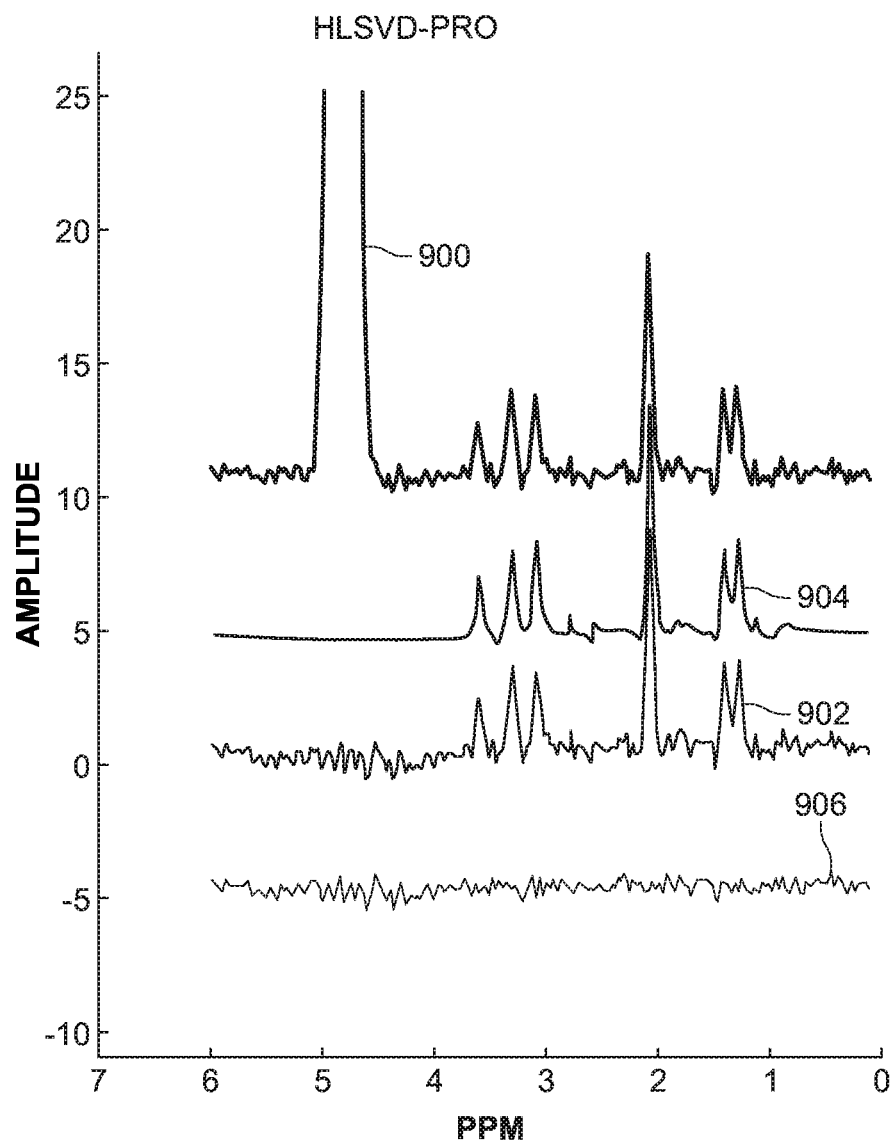

The SCSA and HLSVD-PRO methods were applied on the simulated data and compared in term of quantification of the metabolite peaks. FIG. 9A shows the original MRS signal 900, the suppressed signal 902 calculated with the novel method discussed in FIG. 8, the fitted peaks and baseline 904 also calculated with the method of FIG. 8, and the residue 906 calculated with the algorithm illustrated in FIG. 6 for the simulated data discussed above. FIG. 9B shows the same signals, but calculated with the HLSVD-PRO method for a simulated data using the Lorentzian line shape with a SNR value of 4.5. FIGS. 9C and 9D show the calculated signals noted above, with the novel method and the HLSVD-PRO method, for the simulated data using the Gaussian line shape, with a SNR value of 5. Different SNR values were chosen for the Lorentzian and Gaussian simulated data as the objective was to test the water-suppression using both methods under different B0 field inhomogeneity conditions, and a given noise.

It was observed from these figures that the lineshape and noise for the Lorentzian data did not affect the suppression of the water peak or the quantification of the metabolites. The peak area values were comparable using both methods. The Gaussian data was simulated under the same B0 field inhomogeneity conditions as the Lorentzian data, but at different noise levels to validate the result under other noise conditions. The results were found to be comparable again, as illustrated in FIGS. 9C and 9D. The line broadening due the field inhomogeneity did not affect the water-suppression with the novel SCSA based method and the metabolite peak areas were preserved.

The used simulated data emulate different SNR and $\Delta B0$ inhomogeneity values. The obtained results in FIGS. 9A to 9D show that the performance of the two methods using simulation results are comparable. For a better assessment of the accuracy of these techniques for more realistic lineshapes, their performances were compared, using in vitro and in vivo spectra, as discussed below.

In vitro data presents a more realistic case of MRS data where the peaks are affected by noise and B0 field inhomogeneity conditions. As the HLSVD-PRO method has been proven to be very effective in removing the water residue, the inventors compared in this embodiment the novel SCSA-based method to both the HLSVD-PRO and CHESS, which provides data with residual water peak which is still very high as compared to other metabolite peaks. On the other hand, unsuppressed MRS data without CHESS would provide data with the dominance of the large water peak, making other small metabolites difficult to observe above background noise. The in vitro data used in this embodiment includes the following metabolites: NAA, lac, Cho, and Cr. The SNR of the suppressed signal is calculated as given in equation (12). The absolute concentrations of the metabolites were estimated using equation (14). As shown in Table I in FIG. 10 (which uses Cramer-Rao bounds in % of quantified amplitudes for NAA, Cho, and Cr, ml and PCr metabolite peaks, the SCSA-based method provides similar results as the HLSVD-PRO method in terms of mean and standard deviation.

Figure 11:
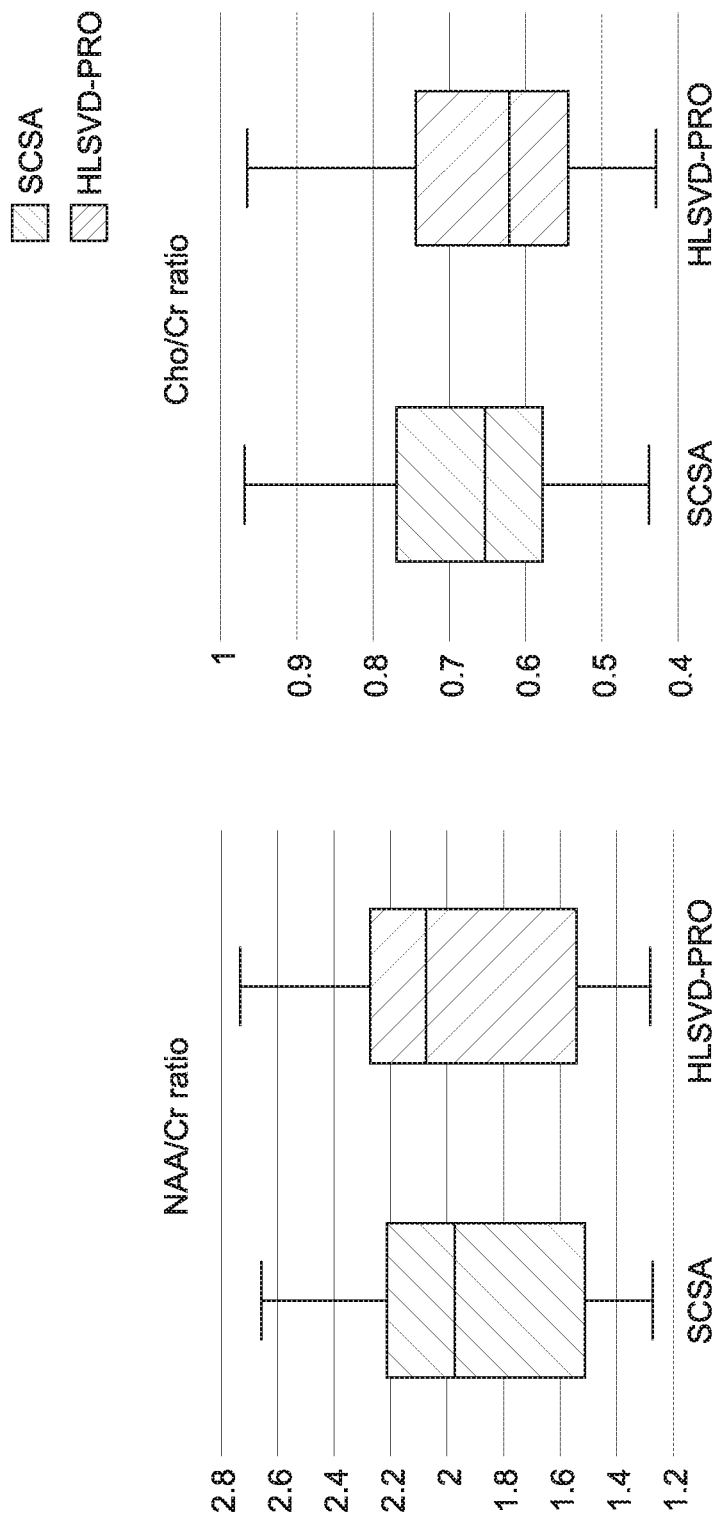
FIG. 11 illustrates the results of the comparison of the method of FIG. 8 and the traditional method for in vivo data.

In vivo data presents a real case of MRS data where the peaks are affected by realistic noise and B0 field inhomogeneity conditions which vary from one region to another. Data from two different brain regions was used with different SNR and line broadening. The in vivo data is usually evaluated using the metabolite ratios NAA/Cr, Cho/Cr, and the SNR of the suppressed signal as defined previously in equation (12). FIG. 11 shows that the performance of the novel SCSA-based method is slightly better compared to HLSVD-PRO method in terms of the residue and provides accurate metabolites ratios, namely NAA/Cr and Cho/Cr, after the water-suppression is applied. In addition, a slight improvement in the SNR is observed with the SCSA.

Based on these tests, the inventors have found that the overall performance of the novel SCSA-based method, considering simulated, in vitro and in vivo data, is better than the HLSVD-PRO method in terms of water-suppression and metabolite quantification. Further, considering the results presented in FIGS. 10 and 11, the novel SCSA-based method improves the SNR of the MRS data as compared to the HLSVD-PRO method, which is highly desirable as it becomes difficult to quantify low amplitude metabolite peaks in noisy data. The novel SCSA-based method also has the advantage of being model independent, making it well suited for the suppression of the water peak with complicated or unknown lineshapes. Therefore, as demonstrated by the results with the in vitro data, most of the metabolite concentrations were preserved better, when compared to HLSVD-PRO, after the water suppression.

Therefore, according to one or more embodiments discussed above, suppression of the residual water signal from proton MRS data in human brain is a prerequisite to an accurate quantification of brain metabolites. A novel and efficient post-processing water suppression method based on the squared eigenfunctions of the Schrödinger operator has been discussed with regard to FIG. 8. The method efficiently extracts the water peak from the MRS unsuppressed water spectrum without altering the small metabolite resonances in the data. The real part of the input spectrum is decomposed into a set of eigenfunctions of the Schrödinger operator. Those eigenfunctions contributing mostly to the water peak are subtracted from the original data using a model independent approach, leading to a water (with complicated or unknown lineshapes) free spectrum, without attenuating the remaining small peaks in the spectrum. This is confirmed by the results obtained from the simulation data, the in vitro data and the in vivo data, as illustrated in FIGS. 10 and 11. Compared to the HLSVD-PRO method, the proposed method provides a water-suppressed signal with higher SNR and a smooth baseline, allowing an accurate data quantification.

Figure 12:
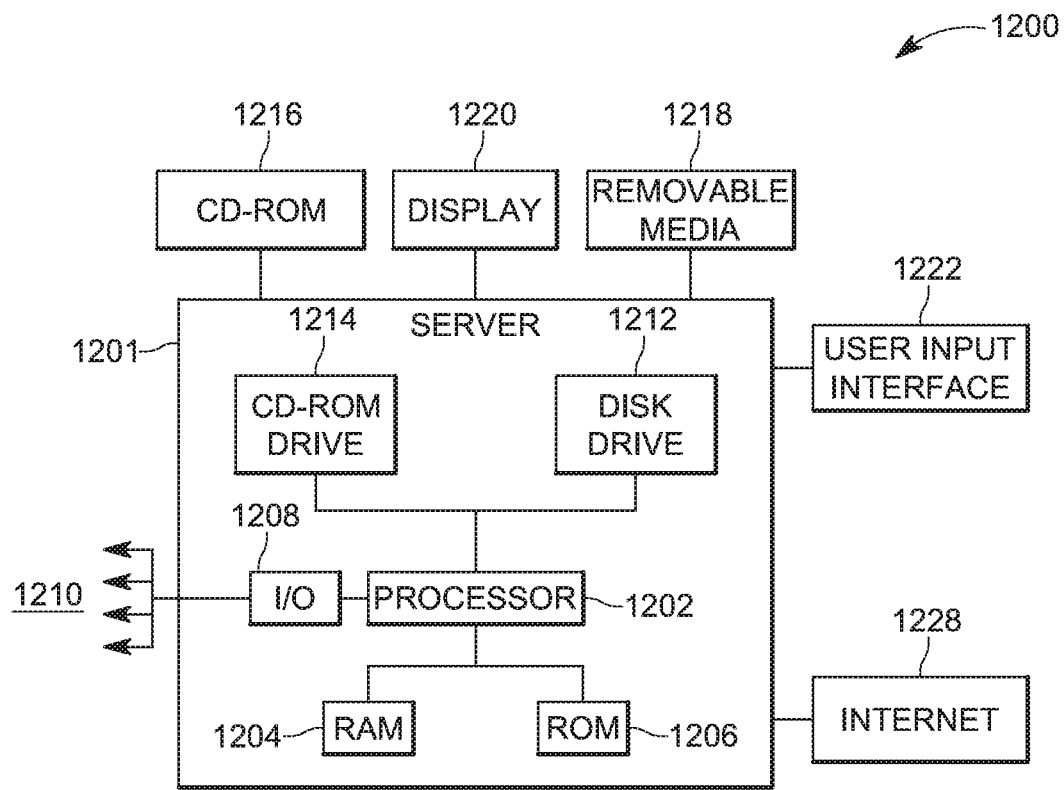
FIG. 12 is a schematic of a computing device in which the methods and processes discussed herein can be implemented.

The above-discussed procedures and methods may be implemented in a computing device as illustrated in FIG. 12.

Hardware, firmware, software or a combination thereof may be used to perform the various steps and operations described herein.

Computing device 1200 suitable for performing the activities described in the embodiments may include a server 1201. Such a server 1201 may include a central processor (CPU) 1202 coupled to a random access memory (RAM) 1204 and to a read-only memory (ROM) 1206. ROM 1206 may also be other types of storage media to store programs, such as programmable ROM (PROM), erasable PROM (EPROM), etc. Processor 1202 may communicate with other internal and external components through input/output (I/O) circuitry 1208 and bussing 1210 to provide control signals and the like. Processor 1202 carries out a variety of functions as are known in the art, as dictated by software and/or firmware instructions.

Server 1201 may also include one or more data storage devices, including disk drives 1212, CD-ROM drives 1214 and other hardware capable of reading and/or storing information, such as DVD, etc. In one embodiment, software for carrying out the above-discussed steps may be stored and distributed on a CD-ROM or DVD 1216, a removable media 1218 or other form of media capable of portably storing information. These storage media may be inserted into, and read by, devices such as CD-ROM drive 1214, disk drive 1212, etc. Server 1201 may be coupled to a display 1220, which may be any type of known display or presentation screen, such as LCD, plasma display, cathode ray tube (CRT), etc. A user input interface 1222 is provided, including one or more user interface mechanisms such as a mouse, keyboard, microphone, touchpad, touch screen, voice-recognition system, etc.

Server 1201 may be coupled to other devices, such as sources, detectors, etc. The server may be part of a larger network configuration as in a global area network (GAN) such as the Internet 1228, which allows ultimate connection to various landline and/or mobile computing devices.

The disclosed embodiments provide a method for water suppression in MRS spectra using squared functions of the Schrödinger operator. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein. The methods or flowcharts provided in the present application may be implemented in a computer program, software or firmware tangibly embodied in a computer-readable storage medium for execution by a general-purpose computer or a processor.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] W. Pijnappel, A. Van den Boogaart, R. De Beer, and D. Van Ormondt, "SVD-based quantification of magnetic resonance signals," Journal of Magnetic Resonance (1969), vol. 97, no. 1, pp. 122-134, 1992.

[2] T. Laudadio, N. Mastronardi, L. Vanhamme, P. Van Hecke, and S. Van Huffel, "Improved Lanczos algorithms for blackbox MRS data quantitation," Journal of magnetic resonance (San Diego, Calif.: 1997), vol. 157, pp. 292-7, August 2002.

[3] H. Barkhuijsen, R. de Beer, and D. van Ormondt, "Improved algorithm for noniterative time-domain model fitting to exponentially damped magnetic resonance signals," Journal of Magnetic Resonance (1969), vol. 73, no. 3, pp. 553-557, Jul. 1987.

[4] T.-M. Laleg-Kirati, E. Cr'epeau, and M. Sorine, "Semi-classical signal analysis," Mathematics of Control, Signals, and Systems, vol. 25, no. 1, pp. 37-61, 2013.

[5] T.-M. Laleg, E. Cr'epeau, Y. Papelier, and M. Sorine, "Arterial blood pressure analysis based on scattering transform i," in Engineering in Medicine and Biology Society, 2007. EMBS 2007. 29th Annual International Conference of the IEEE. IEEE, 2007, pp. 5326-5329.

[6] T.-M. Laleg-Kirati, J. Zhang, E. Achten, and H. Serrai, "Spectral data de-noising using semi-classical signal analysis: application to localized mrs," NMR in Biomedicine, vol. 29, no. 10, pp. 1477-1485,2016.

[7] B. Helffer and T.-M. Laleg-Kirati, "On semi-classical questions related to signal analysis," Asymptotic Analysis.

[8] D. Graveron-Demilly, "Quantification in magnetic resonance spectroscopy based on semi-parametric approaches," Magma (New York, N.Y.), vol. 27, pp. 113-30, April 2014.

What is claimed is:

1. A method for suppressing a water line in an acquired magnetic resonance spectra (MRS) y, the method comprising:
receiving the acquired MRS spectra y;
estimating a water peak $y_{wp}$, which corresponds to the acquired MRS spectra y, using squared eigenfunctions (ψ) of a Schrödinger operator H; and
removing the water peak $y_{wp}$ from the acquired MRS spectra y, by subtracting the water peak $y_{wp}$ from the acquired MRS spectra y, to obtain a suppressed water MRS spectra $y_{ws}$,
wherein the suppressed water MRS spectra $y_{ws}$ includes a signature of one or more metabolites.

2. The method of claim 1, further comprising:
selecting a number $N_{wp}$ of eigenfunctions of the Schrödinger operator.

3. The method of claim 2, wherein the number $N_{wp}$ of eigenfunctions corresponds to those eigenfunctions that have the largest corresponding eigenvalues.

4. The method of claim 2, further comprising:
calculating an optimal value $h_{wp}$ of a parameter h of the Schrödinger operator H.

5. The method of claim 4, wherein the step of calculating comprises:
minimizing a cost function that depends on (1) the number $N_{wp}$ of eigenfunctions and (2) a number $N_h$ of eigenfunctions that use the parameter h.

6. The method of claim 4, further comprising:
calculating a number $N_h$ of eigenfunctions that use the parameter h.

7. The method of claim 6, further comprising:
calculating eigenfunctions and eigenvalues of the Schrödinger operator H for the optimal value $h_{wp}$,
wherein the acquired MRS spectra y is used as a potential of the Schrödinger operator H.

8. The method of claim 7, further comprising:
selecting only eigenfunctions that have a frequency corresponding to the water frequency; and
using only negative eigenvalues and a square of the corresponding eigenfunctions to calculate the water peak $y_{wp}$.

9. The method of claim 8, further comprising:
refining the water peak $y_{wp}$ by using only the eigenfunctions that have a frequency corresponding to the water frequency.

10. The method of claim 1, further comprising:
calculating a water residue based on a ratio between (1) the suppressed water MRS spectra $y_{ws}$ for the water frequency, and (2) the suppressed water MRS spectra $y_{ws}$ for the metabolites frequency.

11. The method of claim 1, further comprising:
identifying the one or more metabolites based on the suppressed water MRS spectra $y_{ws}$.

12. A computing device for suppressing a water line in an acquired magnetic resonance spectra (MRS) y, the computing device comprising:
an interface configured to receive the acquired MRS spectra y; and
a processor connected to the interface and configured to,
estimate a water peak $y_{wp}$, which corresponds to the acquired MRS spectra y, using squared eigenfunctions (ψ) of a Schrödinger operator H, and
remove the water peak $y_{wp}$ from the acquired MRS spectra y, by subtracting the water peak $y_{wp}$ from the acquired MRS spectra y, to obtain a suppressed water MRS spectra $y_{ws}$,
wherein the suppressed water MRS spectra $y_{ws}$ includes a signature of one or more metabolites.

13. The computing device of claim 12, wherein the interface further receives a number $N_{wp}$ of eigenfunctions that correspond to those eigenfunctions that have the largest corresponding eigenvalues.

14. The computing device of claim 13, wherein the processor is further configured to:
calculate an optimal value $h_{wp}$ of a parameter h of the Schrödinger operator H.

15. The computing device of claim 14, wherein the processor is further configured to:
minimize a cost function that depends on (1) the number $N_{wp}$ of eigenfunctions and (2) a number $N_h$ of eigenfunctions that use the parameter h.

16. The computing device of claim 14, wherein the processor is further configured to:
calculate a number $N_h$ of eigenfunctions that use the parameter h.

17. The computing device of claim 16, wherein the processor is further configured to:
calculate eigenfunctions and eigenvalues of the Schrödinger operator H for the optimal value $h_{wp}$,
wherein the acquired MRS spectra y is used as a potential of the Schrödinger operator H.

18. The computing device of claim 17, wherein the processor is further configured to:
select only eigenfunctions that have a frequency corresponding to the water frequency.

19. The computing device of claim 18, wherein the processor is further configured to:
  refine the water peak $y_{wp}$ by using only the eigenfunctions that have a frequency corresponding to the water frequency; and
  identify the one or more metabolites based on the suppressed water MRS spectra $y_{ws}$.

20. A non-transitory computer readable medium including computer executable instructions, wherein the instructions, when executed by a processor, implement instructions for suppressing a water line in an acquired magnetic resonance spectra (MRS) y, the instructions comprising:
  receiving the acquired MRS spectra y;
  estimating a water peak $y_{wp}$, which corresponds to the acquired MRS spectra y, using squared eigenfunctions ($\psi$) of a Schrödinger operator H; and
  removing the water peak $y_{wp}$ from the acquired MRS spectra y, by subtracting the water peak $y_{wp}$ from the acquired MRS spectra y, to obtain a suppressed water MRS spectra $y_{ws}$,
  wherein the suppressed water MRS spectra $y_{ws}$ includes a signature of one or more metabolites.

* * * * *